(12) United States Patent
Funayama et al.

(10) Patent No.: US 7,405,906 B2
(45) Date of Patent: Jul. 29, 2008

(54) CURRENT-PERPENDICULAR-TO-PLANE MAGNETORESISTANCE EFFECT DEVICE WITH DOUBLE CURRENT CONTROL LAYERS

(75) Inventors: Tomomi Funayama, Hino (JP); Masayuki Takagishi, Kunitachi (JP); Katsuhiko Koui, Yokohama (JP); Kohichi Tateyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 377 days.

(21) Appl. No.: 10/936,715

(22) Filed: Sep. 9, 2004

(65) Prior Publication Data

US 2005/0052787 A1  Mar. 10, 2005

(30) Foreign Application Priority Data

Sep. 10, 2003  (JP) ............................. 2003-318918

(51) Int. Cl.
*G11B 5/33* (2006.01)
(52) U.S. Cl. ...................................... 360/314
(58) Field of Classification Search .................. None
See application file for complete search history.

(56) References Cited

U.S. PATENT DOCUMENTS

| | | | |
|---|---|---|---|
| 5,668,688 A | | 9/1997 | Dykes et al. |
| 6,069,820 A * | | 5/2000 | Inomata et al. .............. 365/171 |
| 6,178,074 B1 * | | 1/2001 | Gill ........................... 360/324.2 |
| 6,560,077 B2 * | | 5/2003 | Fujiwara et al. ........... 360/324.1 |
| 6,686,068 B2 * | | 2/2004 | Carey et al. ............... 428/811.3 |
| 6,707,649 B2 * | | 3/2004 | Hasegawa et al. ....... 360/324.12 |
| 6,781,798 B2 * | | 8/2004 | Gill ............................. 360/314 |
| 6,781,801 B2 * | | 8/2004 | Heinonen et al. ......... 360/324.2 |
| 6,822,838 B2 * | | 11/2004 | Lin et al. .................. 360/324.2 |
| 6,937,447 B2 * | | 8/2005 | Okuno et al. ............ 360/324.1 |
| 7,002,781 B2 * | | 2/2006 | Sugawara .............. 360/324.11 |
| 2002/0172840 A1 | | 11/2002 | Terada et al. |
| 2003/0062981 A1 | | 4/2003 | Hosomi et al. |
| 2003/0133234 A1 | | 7/2003 | Furukawa et al. |
| 2004/0042127 A1 * | | 3/2004 | Hoshiya et al. ............. 360/322 |
| 2004/0201929 A1 * | | 10/2004 | Hashimoto et al. ....... 360/324.1 |
| 2005/0111144 A1 * | | 5/2005 | Sbiaa ....................... 360/324.2 |

FOREIGN PATENT DOCUMENTS

| | | |
|---|---|---|
| EP | 0 801 380 A2 | 10/1997 |
| EP | 1 324 316 A2 | 7/2003 |
| JP | 10-55512 | 2/1998 |
| JP | 2002-208744 | 7/2002 |

OTHER PUBLICATIONS

Austrian Search Report dated Apr. 22, 2005 for Singapore Appln. No. 200404491-3.

* cited by examiner

*Primary Examiner*—David D Davis
(74) *Attorney, Agent, or Firm*—Pillsbury Winthrop Shaw Pittman, LLP

(57) ABSTRACT

A magnetoresistance effect element of the dual spin valve type using a current-perpendicular-to-the-plane (CPP) system where a sensing current flows perpendicular to the stacked faces of a plurality of conductive layers, the magnetoresistance effect element comprises a first unit which includes a free layer and a first pinning layer, a second unit which includes the free layer shared with the first unit and a second pinning layer, a first current control layer which is provided in the first unit and limits the flow quantity of the sensing current, and a second current control layer which is provided in the second unit and limits the flow quantity of the sensing current.

9 Claims, 6 Drawing Sheets

CURRENT-PERPENDICULAR-TO-PLANE MAGNETORESISTANCE EFFECT DEVICE WITH DOUBLE CURRENT CONTROL LAYERS

CROSS-REFERENCE TO RELATED APPLICATIONS

This application is based upon and claims the benefit of priority from prior Japanese Patent Application No. 2003-318918, filed Sep. 10, 2003, the entire contents of which are incorporated herein by reference.

BACKGROUND OF THE INVENTION

1. Field of the Invention

This invention relates to a magnetoresistance effect element using a current perpendicular-to-the-plane (CPP) system, a magnetic head including the magnetoresistance effect element, a head suspension assembly, and a magnetic reproducing apparatus. In the CPP system, a sensing current flows perpendicular to the direction in which a plurality of conductive layers are stacked.

2. Description of the Related Art

In recent years, the size of magnetic recording apparatuses, including hard disk units, has been rapidly getting smaller and so the recording density has been getting higher. This trend is expected to become stronger in the future. To achieve high recording density, it is necessary not only to increase the recording track density by narrowing the recording tracks but also to increase the recoding density (or line recording density) in which recording is done.

To reproduce the signal recorded on a medium, an induction head has been used in the existing techniques. As the recording density gets higher, the recording track width becomes narrower. Consequently, the recording bit size gets smaller, with the result that a sufficient reproduced signal output cannot be obtained with the induction head. To overcome this drawback, head using an anisotropic magnetoresistance (AMR) effect (AMR) has been developed. Such an AMR head has been provided under the name of a shield reproduction head. Recently, by making use of the giant magnetoresistance (GMR) effect, a spin valve GMR head with much higher sensitivity has been used. Use of these reproduction heads enables a reproduced signal output of a sufficient level to be obtained, even when the recording bit size is small.

The development of a magnetic head using a tunnel magnetoresistance (TMR) effect element or a CPP-GMR element is in progress and the way of putting the magnetic head into practical use is under investigation. In the existing current-in-plane giant magnetoresistance (CIP-GMR) element, a sensing current flows in the surface of the conductive film. In contrast, in a TMR element or a CPP-GMR element, a sensing current flows in a direction perpendicular to the surface of the conductive film.

A CPP-GMR element has been disclosed in, for example, Jpn. Pat. Appln. KOKAI 10-55512 (reference 1) and U.S. Pat. No. 5,668,688 (reference 2). As disclosed in these references, magnetic heads with a high reproducing sensitivity have been developed. Use of them enables the recorded signal to be reproduced, even when the recording bit size becomes smaller.

It is known that, in the CPP-GMR element, since the resistance of the CPP-GMR film is small in the direction of the film thickness, the absolute value of the amount of resistance change is small and therefore a high output is difficult to obtain. In this connection, a CPP-GMR element which uses a current confining effect to realize a suitable resistance and a high rate of resistance change has been disclosed (e.g., refer to Jpn. Pat. Appln. KOKAI 2002-208744 (reference 3) or U.S. Pat. No. 6,560,077 (reference 4)). The current confining effect is to cause current to flow in the conducting parts scattered in a layer composed mainly of an insulating material in such a manner that the current narrows, thereby increase the rate of resistance change. Hereinafter, a layer which produces a current confining effect is referred to as a current control layer. Reference 3 has disclosed a magnetoresistance effect element which has a plurality of current control layers in a single unit composed of a plurality of conductive layers.

When a plurality of current control layers are used, the positions of the conductive parts of the individual current control layers are very significant. As written in [0078] in reference 3, when the positions of the conductive parts (pinholes) of a plurality of current control layers differ from one another, the resistance value itself can be increased. However, recent research has shown that the current confining effect weakens the effect of increasing the rate of resistance change. Since it is difficult to align the positions of the conductive parts of a plurality of current control layers by the existing techniques, some suitable measures should be taken.

In addition, since there is a limit to the thickness of the current control layers, the application of a voltage higher than the breakdown voltage to the insulating material causes dielectric breakdown, or breakdown. This means that there is a limit to a sensing current that can be applied and therefore the output of the element reaches the highest limit. Since the breakdown is one factor which causes deterioration with age, it decreases the long-term reliability of the magnetoresistance effect element.

BRIEF SUMMARY OF THE INVENTION

According to an aspect of the present invention, there is provided a magnetoresistance effect element of the dual spin valve type using a current-perpendicular-to-the-plane (CPP) system where a sensing current flows perpendicular to the stacked faces of a plurality of conductive layers, the magnetoresistance effect element comprises a first unit which includes a free layer and a first pinning layer; a second unit which includes the free layer shared with the first unit and a second pinning layer; a first current control layer which is provided in the first unit and limits the flow quantity of the sensing current; and a second current control layer which is provided in the second unit and limits the flow quantity of the sensing current.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

Figure 1:
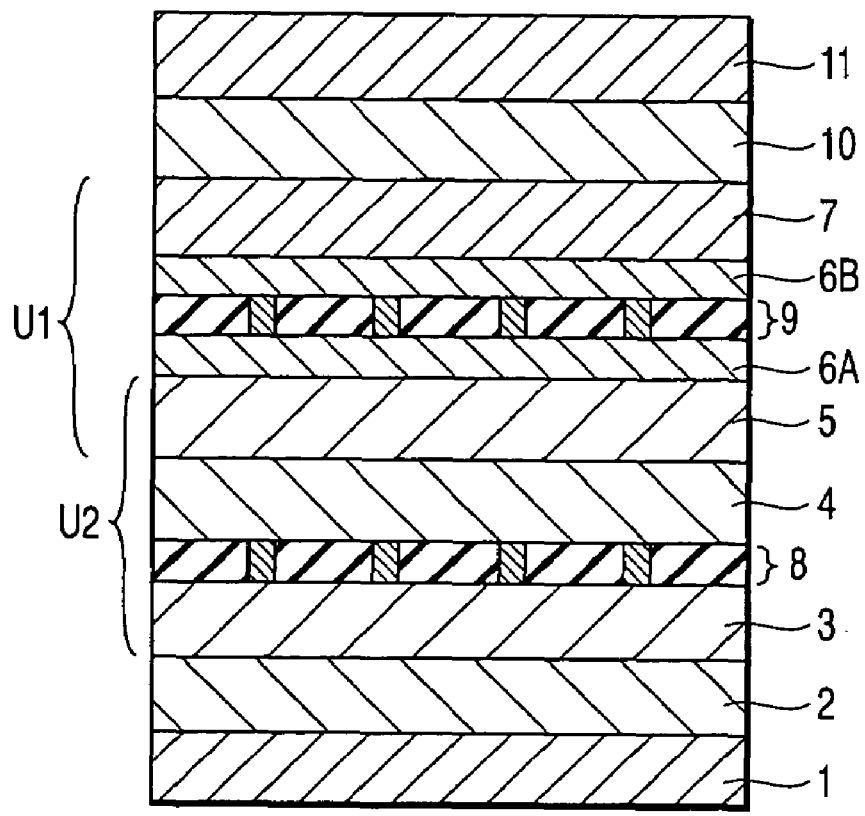
FIG. 1 is a sectional view schematically showing a first embodiment of a magnetoresistance effect element according to the present invention.

FIG. 1 is a sectional view schematically showing a first embodiment of a magnetoresistance effect element according to the present invention. In FIG. 1, on a substrate (not shown), the following are stacked one on top of another in this order: a lower electrode 1, a seed layer 2, a lower pinning layer 3, a first current control layer 8, a lower nonmagnetic intermediate layer 4, a free layer 5, an upper nonmagnetic intermediate layer 6A, a second current control layer 9, an upper nonmagnetic intermediate layer 6B, an upper pinning layer 7, a cap layer 10, and an upper electrode 11.

The first current control layer 8 is formed at the interface between the lower pinning layer 3 and the lower nonmagnetic intermediate layer 4. The upper nonmagnetic intermediate layer 6A and upper nonmagnetic intermediate layer 6B are originally formed as the same film (an upper nonmagnetic intermediate layer 6) in such a manner that the second current control layer 9 is sandwiched between them. The magnetoresistance effect element of FIG. 1 is of the current-perpendicular-to-the-plane (CPP) type. In the magnetoresistance effect element, a sensing current is caused to flow between the lower electrode 1 and the upper electrode 11.

In FIG. 1, a metal magnetic material whose main constituents are Ni, Fe, and Co may be used mainly for the free layer 5. A hard magnetic film, such as CoPt, may be used mainly for the pinning layers 3, 7. A conductive film, such as a Cu, Au, Ag, Pt, Pd, Ir, or Os film, may be used mainly for the nonmagnetic intermediate layers 4, 6.

In FIG. 1, the direction in which the free layer is magnetized varies in response to external magnetic field. Therefore, the resistance value of the free layer 5 varies in response to the external magnetic field. Such a structure is known as a spin valve structure. In FIG. 1, there are provided two units U1, U2 each of which is composed of a free layer, a nonmagnetic intermediate layer, and a pinning layer. The units U1, U2 share the free layer 5. Such a structure is known as a so-called dual spin valve type. In FIG. 1, the structure is further characterized in that a current control layer is provided for each of the units U1, U2.

Figure 2:
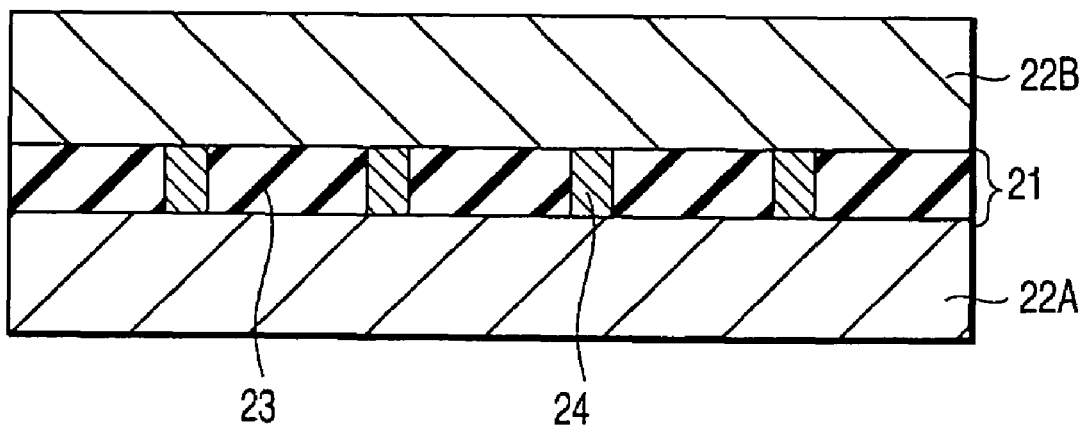
FIG. 2 is a sectional view schematically showing the structure of the current control layers 8, 9 of FIG. 1.

FIG. 2 is a sectional view schematically showing the structure of the current control layers 8, 9 of FIG. 1. The current control layer 21 may be made mainly of an oxide, nitride, or oxynitride of at least one type of element selected from B, Si, Ge, Ta, W, Nb, Al, Mo, P, V, As, Sb, Zr, Ti, Zn, Pb, Th, Be, Cd, Sc, Y, Cr, Sn, Ga, In, Rh, Pd, Mg, Li, Ba, Ca, Sr, Mn, Fe, Co, Ni, Rb, and rare-earth metals. The current control layer 21 is allowed to contain at least one type of metal selected from Cu, Au, Ag, Pt, Pd, Ir, and Os in the range of 1% or more to 50% or less.

The current control layer 21 is formed by oxidizing, nitriding, or oxynitriding an alloy of the aforementioned elements. The oxidizing, nitriding, and oxynitriding methods include a natural oxidizing method, an ion assist oxidizing (oxynitriding) method, and an ion beam irradiation oxidizing method. The natural oxidizing method is a method of just introducing oxygen gas into the chamber of the film-forming unit. The ion assist oxidizing (oxynitriding) method is a method of irradiating ions, such as argon or nitrogen, while introducing oxygen gas into the chamber of the film-forming unit. The ion beam irradiating method is a method of irradiating oxygen ions or nitrogen ions onto the surface of a specimen.

The current control layer 21 is composed mainly of an insulating material 23 which insulates its overlying layer and its underlying layer electrically from each other. In the insulating material 23, conductive materials 24 which connect its overlying and underlying layers electrically to one another are provided in such a manner that they lie scattered. With this configuration, when current flows perpendicular to the film surface, the current is confined to the conductive materials 24. This phenomenon produces a current confining effect. The current confining effect increases the rate of resistance change caused by fluctuations in the external magnetic field. In FIG. 2, a nonmagnetic intermediate layer 22A is provided on the under surface of the current control layer 21 and a nonmagnetic intermediate layer 22B is provided on the top surface of the current control layer 21. In addition to this, even if any layer is adjacent to the current control layer 21, the current confining effect can be obtained.

In the magnetoresistance effect elements in the first embodiment and subsequent embodiments, current basically flows in the conductive parts, the magnetoresistance effect elements have ohmic characteristics. Therefore, for example, the dependence of resistance on the temperature differs, which makes it possible to distinguish the magnetoresistance effect element from an element making use of the tunnel effect.

When the thickness of the current control layer 21 is reduced to about the radius of an atom, the state where the overlying and underlying layers of the current control layer 21 are separated by the insulating material 23 cannot be produced. Therefore, the insulating property of the part to control current deteriorates, which impairs the current confining effect. To avoid this, it is desirable that the thickness of the control current layer 21 should be 0.4 nanometers or more. Conversely, when the current control layer 21 becomes too thick, it is difficult to connect the overlying and underlying layers (the nonmagnetic intermediate layers 22A, 22B in FIG. 2) of the current control layer 21 to each other with the conductive material 24. Therefore, it is desirable that the thickness of the current control layer 21 should be 3 nanometers or less, preferably 2 nanometers or less.

In the current control layer 21, a sensing current basically flows in the conductive materials 24. The voltage to cause the sensing current to flow is also applied to the insulating material 23. When the voltage exceeds the breakdown voltage of the insulating material 23, a breakdown will take place, resulting in the destruction of the element. As described above, since it is difficult to increase the film thickness of the current control layer 21, it is difficult to raise the breakdown voltage by the thickness of the current control layer 21.

In the first embodiment, to overcome this problem, the breakdown voltage is raised by providing a plurality of current control layers 21. In FIG. 1, for example, let the breakdown voltage of the current control layer 8 be Vb1 and the breakdown voltage of the current control layer 9 be Vb2. Since the current control layers 8, 9 are connected in series electrically, the voltage to cause a sensing current to flow is distributed to the current control layers 8, 9. If the breakdown voltage of the entire magnetoresistance effect element is Vb, then Vb=Vb1+Vb2. Therefore, with the first embodiment, the breakdown voltage Vb of the magnetoresistance effect element can be increased and therefore the long-term reliability can be improved. In addition, a high output can be obtained by increasing the sensing current.

In the spin valve magnetoresistance effect element, a free layer, a nonmagnetic intermediate layer, and a pinning layer form a set. This set acts as a unit. In a case where two current control layers are provided in a unit, the current confining effect acts maximally in a state where the positions of the conductive materials 24 of two current control layers coincide with the direction in which the film is formed. However, it is difficult to realize this state by the existing techniques. In many cases, the positions of the conductive materials of the individual current control layers are irregular, preventing the greatest current confining effect.

In the first embodiment, to overcome this problem, a plurality of units are provided to provide a plurality of current control layers, instead of limiting the number of current control layers in each unit to one. With this configuration, even if the positions of the conductive materials of the current control layers do not coincide with one another, the current confining effect can be prevented from being impaired. Therefore, a high rate of resistance change can be secured, which enables a high-level output to be obtained. It is known that the dual spin valve structure itself produces a higher-level output. Therefore, the above configuration combines with the dual spin valve structure to produce a much higher output.

To sum up, in the first embodiment, there are provided two units each of which is composed of a free layer, a nonmagnetic intermediate layer, and a pinning layer. A CPP magnetoresistance effect element is formed using a dual spin valve structure where the two units share a single free layer. A current control layer is provided for each of the units, thereby raising the breakdown voltage of the magnetoresistance effect element without impairing the current confining effect. Consequently, not only can a high output be obtained, but the reliability can also be increased.

Second Embodiment

Figure 3:
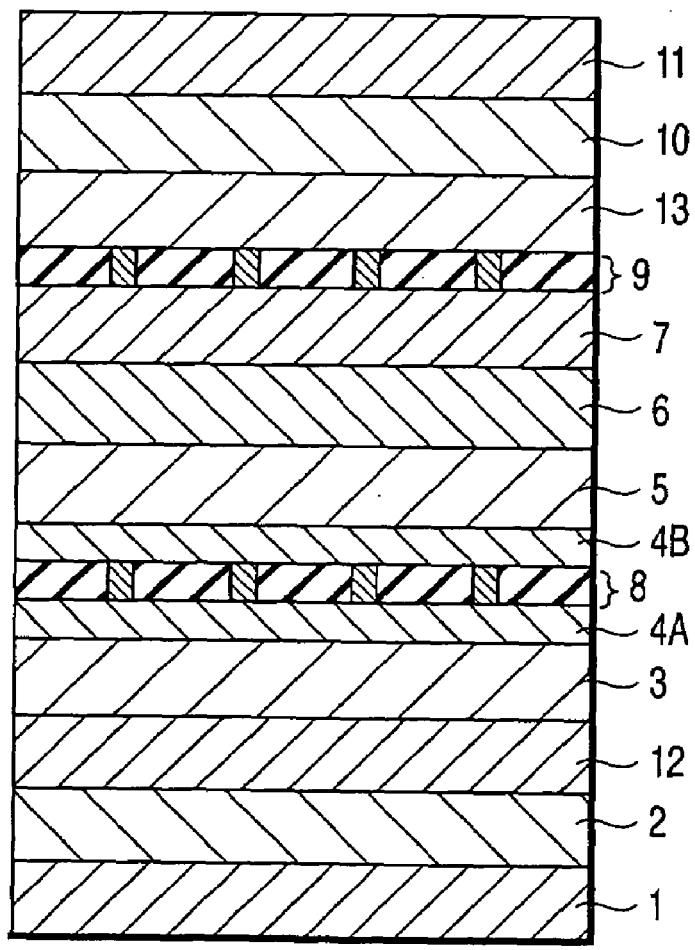
FIG. 3 is a sectional view schematically showing a second embodiment of the magnetoresistance effect element according to the present invention.

FIG. 3 is a sectional view schematically showing a second embodiment of the magnetoresistance effect element according to the present invention. In FIG. 3, the same parts as those in FIG. 1 are indicated by the same reference numerals. Only the parts differing from FIG. 1 will be explained. In FIG. 3, on a substrate (not shown), the following are stacked one on top of another in this order: a lower electrode 1, a seed layer 2, a lower antiferromagnetic layer 12, a lower pinning layer 3, a lower nonmagnetic intermediate layer 4A, a first current control layer 8, a lower nonmagnetic intermediate layer 4B, a free layer 5, an upper nonmagnetic intermediate layer 6, an upper pinning layer 7, a second current control layer 9, an upper antiferromagnetic layer 13, a cap layer 10, and an upper electrode 11.

The second current control layer 9 is formed at the interface between the upper pinning layer 7 and the upper antiferromagnetic layer 13.

The first current control layer 8 is formed at the interface between the lower nonmagnetic intermediate layer 4A and the lower nonmagnetic intermediate layer 4B. That is, the first current control layer 8 is formed in such a manner that it is inserted in the lower nonmagnetic intermediate layer 4.

In FIG. 3, the magnetoresistance effect element is characterized by including the lower antiferromagnetic layer 12 and upper antiferromagnetic layer 13. In this case, metal magnetic material mainly made of Ni, Fe, or Co (that is, of the same composition as the free layer 5) may be used mainly for the pinning layers 3, 7. The pinning layers 3, 7 may be formed using a so-called synthetic structure where nonmagnetic layers, such as Ru, are sandwiched between a plurality of magnetic layers.

The lower antiferromagnetic layer 12 stabilizes the direction of magnetization of the lower pinning layer 3 more firmly. The upper antiferromagnetic layer 13 stabilizes the direction of magnetization of the upper pinning layer 7 more firmly. This configuration not only produces the same effect as in the first embodiment but also stabilizes the rate of resistance change. That is, the rate of resistance change sensitively following a change in the external magnetic field can be obtained stably, regardless of a long elapse of time. Consequently, it is possible to obtain a high-level output stably.

Third Embodiment

Figure 4:
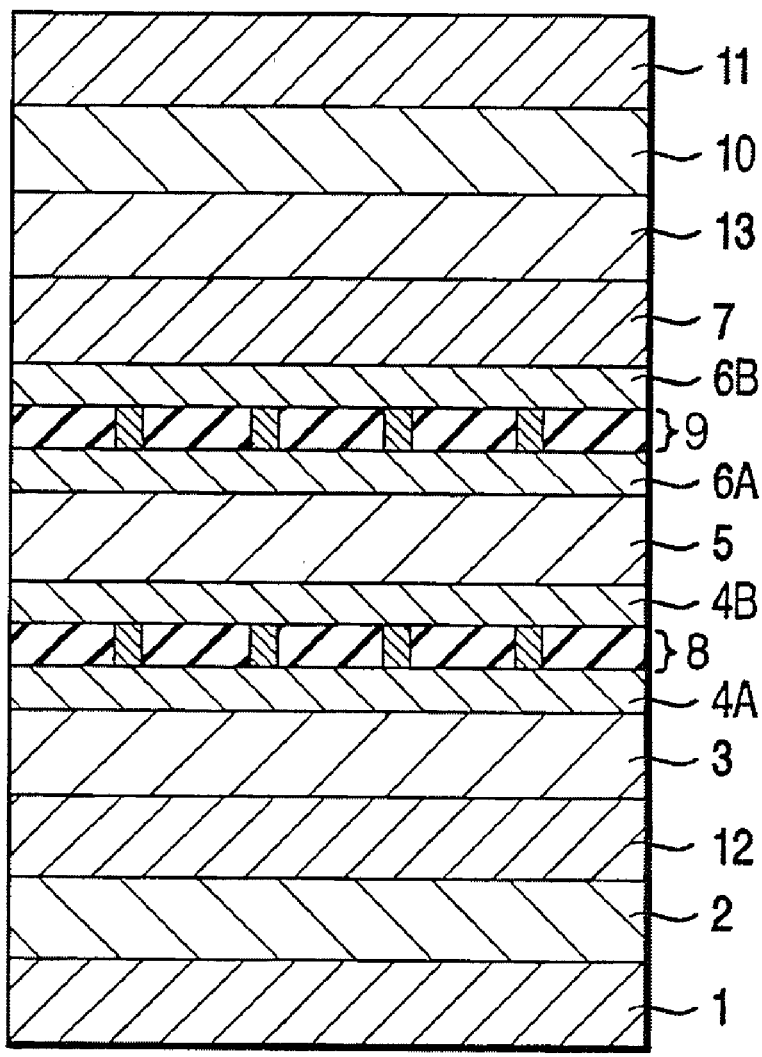
FIG. 4 is a sectional view schematically showing a third embodiment of the magnetoresistance effect element according to the present invention.

FIG. 4 is a sectional view schematically showing a third embodiment of the magnetoresistance effect element according to the present invention. In FIG. 4, the same parts as those in FIGS. 1 and 3 are indicated by the same reference numerals. Only the parts differing from FIGS. 1 and 3 will be explained. In FIG. 4, on a substrate (not shown), the following are stacked one on top of another in this order: a lower electrode 1, a seed layer 2, a lower antiferromagnetic layer 12, a lower pinning layer 3, a lower nonmagnetic intermediate layer 4A, a first current control layer 8, a lower nonmagnetic intermediate layer 4B, a free layer 5, an upper nonmagnetic intermediate layer 6A, a second current control layer 9, an upper nonmagnetic intermediate layer 6B, an upper pinning layer 7, an upper antiferromagnetic layer 13, a cap layer 10, and an upper electrode 11. The second current control layer 9 is provided so as to be sandwiched between the upper nonmagnetic intermediate layer 6A and the upper nonmagnetic intermediate layer 6B. The upper pinning layer 7 is stacked next to the upper antiferromagnetic layer 13.

The configuration of FIG. 4 produces the same effects as in the first and second embodiments. In the state where the current control layer is inserted between the nonmagnetic intermediate layers, the current confining effect presents the highest rate of resistance change. That is, in a state where the nonmagnetic intermediate layers are stacked adjoining to both of the interfaces of the current control layer, the rate of resistance change is realized most efficiently by the current confining effect.

The stacked structure of FIG. 4 realizes this, achieving a higher rate of resistance change than in the first and second embodiments. Consequently, when the present invention is embodied, the configuration of FIG. 4 is the most favorable and produces the highest output.

Fourth Embodiment

Figure 5:
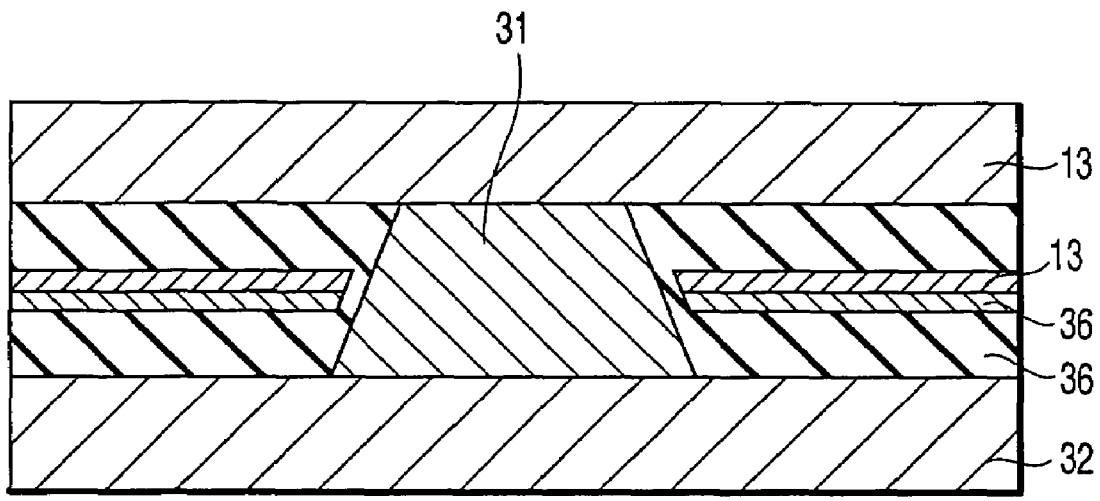
FIG. 5 is a sectional view schematically showing a magnetic head formed using the magnetoresistance effect element shown in each of FIGS. 1 to 4.

FIG. 5 is a sectional view schematically showing a magnetic head formed using the magnetoresistance effect element shown in each of FIGS. 1 to 4. In FIG. 5, an NiFe layer is formed to a thickness of about 1 micrometer on an Al—Ti—C substrate (not shown). The layer serves as a lower electrode and shield layer 32. In the fourth embodiment, after the lower electrode and shield layer 32 is patterned by photolithography and dry etching, the following films are formed in this order to form a magnetoresistance effect film 31: a seed layer 2 of Ta (5 nanometers)/Ru (2 nanometers), a lower pinning layer 3 of CoPt (10 nanometers), a first current control layer 8 obtained by oxidizing a CuAl stacked film (1 nanometer), a lower nonmagnetic layer 4 of Cu (1 nanometer), a free layer 5 of CoFe (1 nanometer)/NiFe (4 nanometers)/CoFe (1 nanometer), an upper nonmagnetic intermediate layer 6A of Cu (0.5 nanometers), a second current control layer obtained by oxidizing a CuAl stacked film (1 nanometer), an upper nonmagnetic intermediate layer 6B of Cu (0.5 nanometers), an upper pinning layer 7 of CoPt (10 nanometers), and a cap layer 10 of Cu (1 nanometer)/Ta (5 nanometers). The magnetoresistance effect film 31 formed in the process has the same configuration as in FIG. 1.

Then, after the magnetoresistance effect film 31 is annealed in a magnetic field at 270° C. for 10 hours, the annealed film is patterned by photolithography and dry etching. With the resist used in pattering left, an insulating layer 34 made of Al2O3, a magnetic layer 36 made of NiFe, and an antiferromagnetic layer 37 made of IrMn are formed. Then, after an insulating layer 34 is further formed, the element is lifted off. Then, while a magnetic field is being applied in a direction perpendicular to the direction of the magnetic field in the preceding heat treatment, the element is annealed in the magnetic field at 200° C. for one hour. Finally, an NiFe film is formed to a thickness of about 1 micrometer. The NiFe film is patterned by photolithography and dry etching, thereby producing an upper electrode and shield layer 33.

The magnetic head formed by the above processes is used as a sample of the fourth embodiment. A magnetic head formed by similar processes using a magnetoresistance effect film obtained by eliminating the first current control layer 8 and the second current control layer 9 from the configuration of FIG. 1 is used as comparative sample 1. In addition, a magnetic head formed by similar processes using a magnetoresistance effect film obtained by eliminating only the second current control layer 9 from the configuration of FIG. 1 is used as comparative sample 2.

In each sample, the dependence of the resistance value on an external magnetic field was measured and the rate of resistance change was determined. Moreover, from the I-V characteristic (current-voltage characteristic), the breakdown voltage was measured. The results are listed in Table 1.

TABLE 1

| | Rate of resistance change | Breakdown voltage |
|---|---|---|
| Sample of the fourth embodiment | 7% | 550 mv |
| Comparative sample 1 | 2% | 450 mv |
| Comparative sample 2 | 3.5% | 300 mv |

In the sample of the fourth embodiment, both of the rate of resistance change and the breakdown voltage are higher than those in comparative sample 1 and comparative sample 2. In the sample of the fourth embodiment, the breakdown voltage has a good value, as high as 500 mV or more. In comparative example 2, the rate of resistance change is higher than in comparative example 1, but its breakdown voltage is lower. From these things, it has been proved that a high rate of resistance change can be made compatible with a high breakdown voltage by forming a magnetic head using a magnetoresistance effect element with the stacked structure of the first embodiment.

Fifth Embodiment

Figure 6:
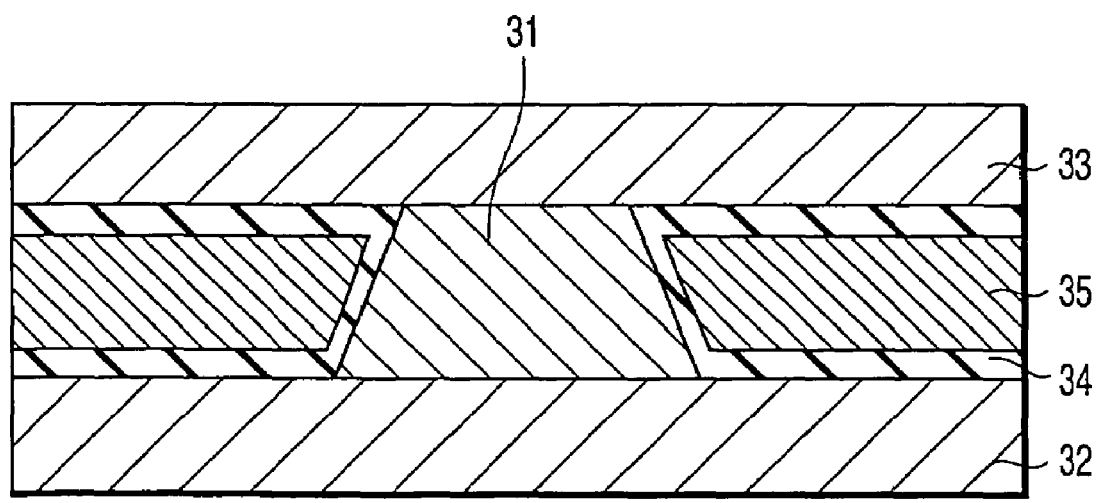
FIG. 6 is a sectional view schematically showing another example of the magnetic head formed using the magnetoresistance effect element shown in each of FIGS. 1 to 4.

FIG. 6 is a sectional view schematically showing another example of the magnetic head formed using the magnetoresistance effect element shown in each of FIGS. 1 to 4. In FIG. 6, an NiFe layer is formed to a thickness of about 1 micrometer on an Al—Ti—C substrate (not shown). The layer serves as a lower electrode and shield layer 32. In the fifth embodiment, after the lower electrode and shield layer 32 is patterned by photolithography and dry etching, the following films are formed in this order to form a magnetoresistance effect film 31: a seed layer 2 of Ta (5 nanometers)/Ru (2 nanometers), a lower antiferromagnetic layer 12 of PtMn (12 nanometers), a lower pinning layer 3 of CoFe (4 nanometers)/Ru (1 nanometer)/CoFe (4 nanometers), a lower nonmagnetic layer 4A of Cu (0.5 nanometers), a first current control layer 8 obtained by oxidizing a CuCr stacked layer (0.7 nanometers), a lower nonmagnetic layer 4B of Cu (0.5 nanometers), a free layer 5 of CoFe (1 nanometer)/NiFe (4 nanometers)/CoFe (1 nanometer), an upper nonmagnetic intermediate layer 6 of Cu (1 nanometer), an upper pinning layer 7 of CoFe (4 nanometers)/Ru (1 nanometer)/CoFe (4 nanometers), a second current control layer 9 obtained by oxidizing a CuCr stacked layer (0.7 nanometers), an upper antiferromagnetic layer 13 of PtMn (12 nanometers), and a cap layer 10 of Cu (1 nanometer)/Ta (5 nanometers). The magnetoresistance effect film 31 formed by the processes has the same configuration as in FIG. 3.

Then, after the magnetoresistance effect film 31 is annealed in a magnetic field at 270° C. for 10 hours, the annealed film is patterned by photolithography and dry etching. With the resist used in pattering left, an insulating layer 34 made of Al2O3 and a bias layer 35 made of CoPt are formed. Then, after an insulating layer 34 is further formed, the element is lifted off. Finally, an NiFe film is formed to a thickness of about 1 micrometer. The NiFe film is patterned by photolithography and dry etching, thereby producing an upper electrode and shield layer 33.

The magnetic head formed by the above processes is used as a sample of the fifth embodiment. A magnetic head formed by similar processes using a magnetoresistance effect film obtained by eliminating the first current control layer 8 and the second current control layer 9 from the configuration of FIG. 3 is used as comparative sample 3. In addition, a magnetic head formed by similar processes using a magnetoresistance effect film obtained by eliminating only the second current control layer 9 from the configuration of FIG. 3 is used as comparative sample 4.

In each sample, the dependence of the resistance value on an external magnetic field was measured and the rate of resistance change was determined. Moreover, from the I-V characteristic (current-voltage characteristic), the breakdown voltage was measured. The results are listed in Table 2.

TABLE 2

| | Rate of resistance change | Breakdown voltage |
|---|---|---|
| Sample of the fifth embodiment | 7.5% | 570 mv |
| Comparative sample 3 | 1.8% | 450 mv |
| Comparative sample 4 | 3.2% | 320 mv |

In the sample of the fifth embodiment, both of the rate of resistance change and the breakdown voltage are higher than those in comparative sample 3 and comparative sample 4. In the sample of the fifth embodiment, the breakdown voltage has a good value, as high as 500 mV or more. In comparative example 4, the rate of resistance change is higher than in comparative example 3, but its breakdown voltage is lower. From these things, it has been proved that a high rate of resistance change can be made compatible with a high breakdown voltage by forming a magnetic head using a magnetoresistance effect element with the stacked structure of the second embodiment. Furthermore, it has been also proved that the magnetoresistance effect element with the stacked structure of the second embodiment has a better performance than the magnetoresistance effect element with the stacked structure of the first embodiment.

Sixth Embodiment

A sixth embodiment of the present invention differs from the fifth embodiment in the stacked structure of the magnetoresistance effect film 31. In FIG. 6, an NiFe layer is formed to a thickness of about 1 micrometer on an Al—Ti—C substrate (not shown). The layer serves as a lower electrode and shield layer 32. In the sixth embodiment, after the lower electrode and shield layer 32 is patterned by photolithography and dry etching, the following films are formed in this order to form a magnetoresistance effect film 31: a seed layer 2 of Ta (5 nanometers)/Ru (2 nanometers), a lower antiferromagnetic layer 12 of IrMn (5 nanometers), a lower pinning layer 3 of CoFe (4 nanometers)/Ru (1 nanometer)/CoFe (4 nanometers), a lower nonmagnetic layer 4A of Cu (0.3 nanometers), a first current control layer 8 obtained by oxidizing a CuAl stacked layer (0.9 nanometers), a lower nonmagnetic layer 4B of Cu (0.3 nanometers), a free layer 5 of CoFe (1 nanometer)/NiFe (4 nanometers)/CoFe (1 nanometer), an upper nonmagnetic intermediate layer 6A of Cu (0.3 nanometers), a second current control layer 9 obtained by oxidizing a CuAl stacked layer (0.9 nanometers), an upper nonmagnetic intermediate layer 6B of Cu (0.3 nanometers), an upper pinning layer 7 of CoFe (4 nanometers)/Ru (1 nanometer)/CoFe (4 nanometers), an upper antiferromagnetic layer 13 of IrMn (5 nanometers), and a cap layer 10 of Cu (1 nanometer)/Ta (5 nanometers). The magnetoresistance effect film 31 formed by the processes has the same configuration as in FIG. 4.

The magnetic head formed by the above processes is used as a sample of the sixth embodiment. A magnetic head formed by similar processes using a magnetoresistance effect film obtained by eliminating the first current control layer 8 and the second current control layer 9 from the configuration of FIG. 4 is used as comparative sample 5. In addition, a magnetic head formed by similar processes using a magnetoresistance effect film obtained by eliminating only the second current control layer 9 from the configuration of FIG. 4 is used as comparative sample 6.

In each sample, the dependence of the resistance value on an external magnetic field was measured and the rate of resistance change was determined. Moreover, from the I-V characteristic (current-voltage characteristic), the breakdown voltage was measured. The results are listed in Table 3.

TABLE 3

| | Rate of resistance change | Breakdown voltage |
|---|---|---|
| Sample of the sixth embodiment | 9% | 600 mv |
| Comparative sample 5 | 2.3% | 420 mv |
| Comparative sample 6 | 3.7% | 300 mv |

In the sample of the sixth embodiment, both of the rate of resistance change and the breakdown voltage are higher than those in comparative sample 5 and comparative sample 6. In the sample of the sixth embodiment, the breakdown voltage has a good value, as high as 500 mV or more. In comparative example 6, the rate of resistance change is higher than in comparative example 5, but its breakdown voltage is lower. From these things, it has been proved that a high rate of resistance change can be made compatible with a high breakdown voltage by forming a magnetic head using a magnetoresistance effect element with the stacked structure of the third embodiment. Furthermore, it has been also proved that the magnetoresistance effect element with the stacked structure of the third embodiment has a better performance than the magnetoresistance effect element with the stacked structure of the second embodiment.

Seventh Embodiment

Figure 7:
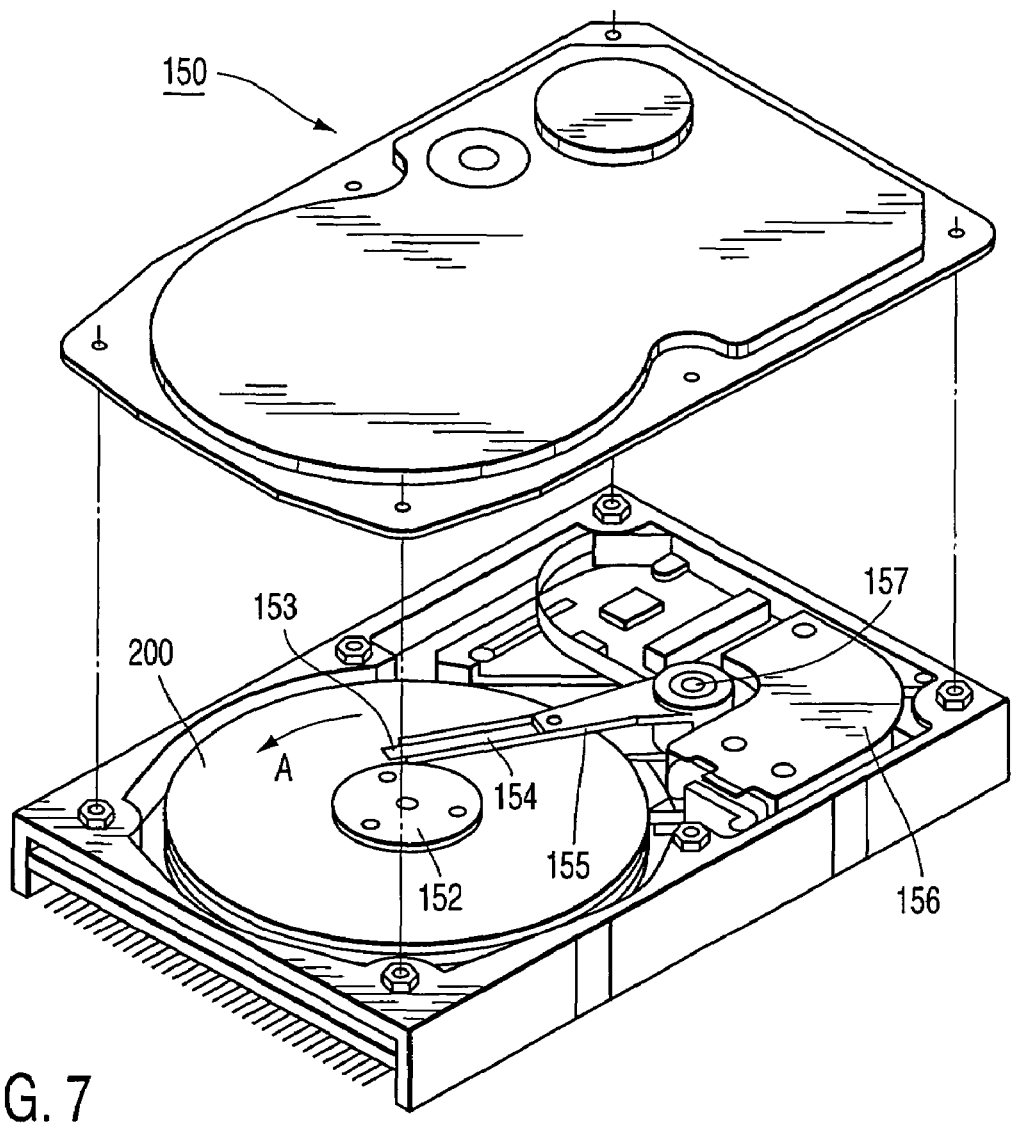
FIG. 7 is a perspective view of a hard disk unit in which the magnetoresistance effect element shown in each of FIGS. 1 to 6 can be installed.

FIG. 7 is a perspective view of a hard disk unit in which the magnetoresistance effect element shown in each of FIGS. 1 to 6 can be installed. A magnetoresistance effect element related to the present invention can be installed in a magnetic reproducing apparatus which reads digital data magnetically recorded on a magnetic recording medium. A typical magnetic recording medium is a platter built in a hard disk drive. In addition, a magnetoresistance effect element related to the present invention can be installed in a magnetic recording and reproducing apparatus which also has the function of writing digital data onto a magnetic recording medium.

In a hard disk unit 150 of FIG. 7, a rotary actuator is used to move a magnetic head. In FIG. 7, a recording disk medium 200 is installed on a spindle 152. The disk medium 200 is rotated in the direction shown by arrow A by a motor (not shown) which responds to a control signal from a driving unit control section (not shown). More than one disk medium 200 may be provided. This type of apparatus is known as the multi-platter type.

A head slider 153, which is provided at the tip of a thin-film suspension 154, stores information onto the disk medium 200 or reproduces the information recorded on the disk medium 200. The head slider 153 has the magnetic head of FIG. 5 or 6 provided near its tip.

The rotation of the disk medium 200 causes the air bearing surface (ABS) of the head slider 153 to float a specific distance above the surface of the disk medium 200. The present invention is applicable to a so-called contact running unit in which the slider is in contact with the disk medium 200.

The suspension 154 is connected to one end of an actuator arm 155 which includes a bobbin section (not shown) that holds a driving coil (not shown). A voice coil motor 156, a type of linear motor, is provided to the other end of the actuator arm 155. The voice coil motor 156 is composed of a driving coil (not shown) wound around the bobbin section of the actuator arm 155 and a magnetic circuit including a permanent magnet and a facing yoke which are provided in such a manner that the magnet and yoke face each other with the coil sandwiched between them.

The actuator arm 155 is held by ball bearings (not shown) provided in the upper and lower parts of the spindle 157 in such a manner that the arm 155 can be rotated freely by the voice coil motor 156.

Eighth Embodiment

Figure 8:
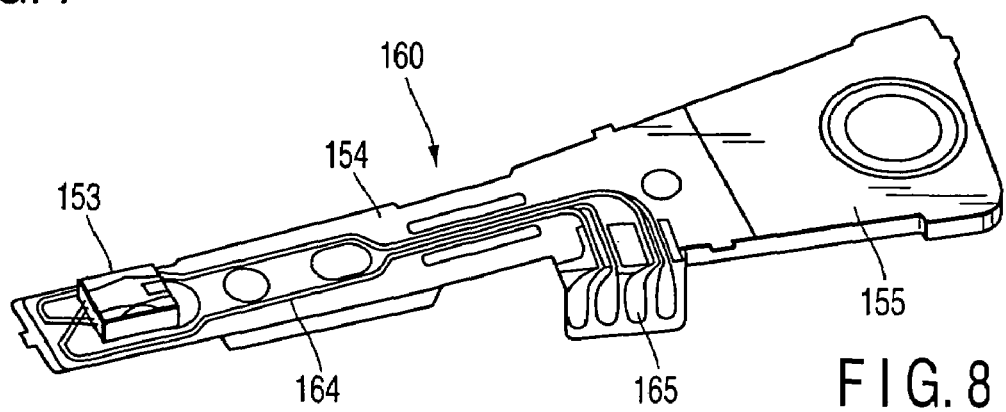
FIG. 8 is an enlarged perspective view of the tip part extending from the actuator arm 155 of a magnetic head assembly 160 in the hard disk unit of FIG. 7, when looked at from the medium side.

FIG. 8 is an enlarged perspective view of the tip part extending from the actuator arm 155 of a magnetic head assembly 160 in the hard disk unit of FIG. 7, when looked at from the medium side. In FIG. 8, the magnetic head assembly 160 has the actuator arm 155. A suspension 154 is connected to one end of the actuator arm 155. At the tip of the suspension 154, there is provided a head slider 153 including the magnetic head of FIG. 5 or 6. The suspension 154 has leads 164 for writing and reading a signal. The leads 164 are connected electrically to the individual electrodes of the magnetic head built in the head slider 153. The leads 164 are also connected to electrode pads 165.

As shown in FIGS. 7 and 8, implementing the hard disk by use of the magnetoresistance effect element of any one of FIGS. 1 to 4 and the magnetic head of FIG. 5 of 6 makes it possible to realize a higher breakdown voltage and a higher reproduced output than those in the existing hard disk unit. Accordingly, the magnetic recording density can be further improved and therefore the recording capacity can be increased more.

Ninth Embodiment

Figure 9:
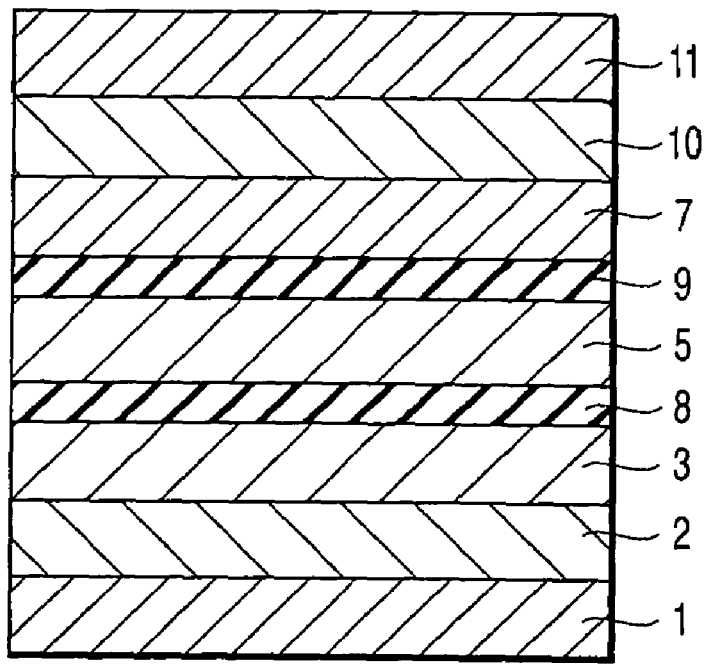
FIG. 9 is a sectional view schematically showing ninth embodiment of the magnetoresistance effect element related to the present invention.

FIG. 9 is a sectional view schematically showing ninth embodiment of the magnetoresistance effect element related to the present invention. In FIG. 9, on a substrate (not shown), the following are stacked one on top of another in this order: a lower electrode 1, a seed layer 2, a lower pinning layer 3, a first current control layer 8, a free layer 5, a second current control layer 9, an upper pinning layer 7, a cap layer 10, and an upper electrode 11.

The first current control layer 8 is formed between the lower pinning layer 3 and the free layer 5. The second current control layer 9 is formed between the free layer 5 and the upper pinning layer 7. The magnetoresistance effect element of FIG. 9 is of the current-perpendicular-to-the-plane (CPP) type. In the magnetoresistance effect element, a sensing current is caused to flow between the lower electrode 1 and the upper electrode 11.

In FIG. 9, a metal magnetic material whose main constituents are Ni, Fe, and Co may be used mainly for the free layer 5. A hard magnetic film, such as CoPt, may be used mainly for the pinning layers 3, 7.

The magnetoresistance effect element configured as described above has a spin valve structure. In FIG. 9, there are provided two units each of which is composed of a free layer, a nonmagnetic intermediate layer, and a pinning layer. The units share the free layer 5. This type of configuration is called the dual spin valve type. The configuration is further characterized in that a current control layer is provided for each of the units. In FIG. 9, the current control layers act also as nonmagnetic intermediate layers for the corresponding units.

Figure 10:
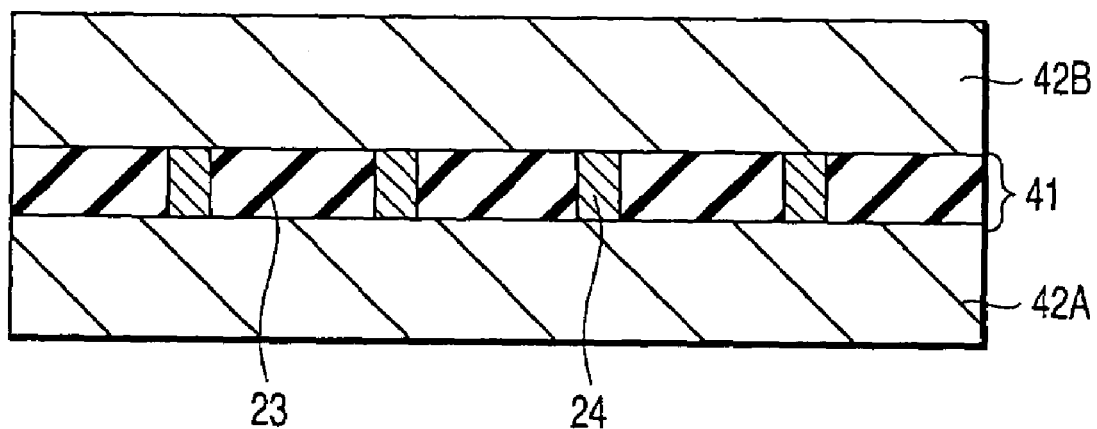
FIG. 10 is a sectional view showing the structure of the current control layers 8, 9 of FIG. 9.

FIG. 10 is a sectional view showing the structure of the current control layers 8, 9 of FIG. 9. In FIG. 10, a current control layer 41 has the same composition as that of the current control layer 21 of FIG. 2 and is formed by the same processes. Magnetic layers 42A, and 42B are formed on the top and under surfaces of the current control layer 41. Of these layers, the underlying layer (42A) is used as a free layer and the overlying layer (42B) is used as a pinning layer. In addition to this, even if any layer is adjacent to the current control layer 41, the current confining effect can be obtained.

When the thickness of the current control layer 41 is reduced to about the radius of an atom, the current confining effect is impaired. Therefore, it is desirable that the thickness of the current control layer 41 should be 0.4 nanometers or more. Conversely, when the current control layer 41 becomes too thick, it is difficult to connect the overlying and underlying layers (the magnetic layers 42A, 42B in FIG. 10) of the current control layer 41 to each other with the conductive material 24. Therefore, it is desirable that the thickness of the current control layer 41 should be 3 nanometers or less, preferably 2 nanometers or less.

With the configuration of FIG. 10, too, a high output can be obtained as in the first embodiment. In FIG. 9, the voltage to cause a sensing current to flow is divided by the current control layers 8, 9. Therefore, with the ninth embodiment, too, the breakdown voltage Vb of the magnetoresistance effect element can be increased and therefore the long-term reliability can be improved. Moreover, a high output can be obtained by increasing the sensing current. In addition, in the ninth embodiment, to achieve a much higher breakdown voltage, a plurality of current control layers may be provided in each unit.

To sum up, in the ninth embodiment, there are provided two units each of which is composed of a free layer, a current control layer also acting as a nonmagnetic intermediate layer, and a pinning layer. A CPP magnetoresistance effect element is formed using a dual spin valve structure where the two units share a single free layer. A current control layer is provided for each of the units, thereby raising the breakdown voltage of the magnetoresistance effect element without impairing the current confining effect. Consequently, not only can a high output be obtained, but the reliability can also be increased.

The present invention is not limited to the above embodiments. For instance, the order in which the conductive layers are stacked is not limited to FIGS. 1 to 4, FIG. 9, and FIG. 10. Specifically, the objects of the present invention are achieved by forming at least one current control layer in each unit including a free layer and a pinning layer in the CPP dual spin valve magnetoresistance effect element. In addition, a nonmagnetic intermediate layer is not necessarily formed in each unit.

Furthermore, the magnetoresistance effect film of any one of FIGS. 3, 4, and 9 may be applied to the magnetoresistance effect film 31 of FIG. 5. Moreover, the magnetoresistance effect film of any one of FIGS. 1 and 9 may be applied to the magnetoresistance effect film 31 of FIG. 6.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistance effect element of the dual spin valve type using a current-perpendicular-to-the-plane (CPP) system where a sensing current flows perpendicular to the stacked faces of a plurality of conductive layers, the magnetoresistance effect element comprising:

a first unit which includes a free layer; and a second unit which includes the free layer shared with the first unit;
the first unit including:
a first upper nonmagnetic intermediate layer;
a second upper nonmagnetic intermediate layer; and
a first current control layer which limits the flow quantity of the sensing current and is sandwiched between the first and second upper nonmagnetic intermediate layers;
the second unit including:
a first lower nonmagnetic intermediate layer;
a second lower nonmagnetic intermediate layer; and
a second current control layer which limits the flow quantity of the sensing current and is sandwiched between the first and second lower nonmagnetic intermediate layers;
the first current control layer including:
an insulating material which insulates the first and second upper nonmagnetic intermediate layers from each other electrically, and
a conductive material which is formed in the insulating material in a distributed manner and which connects the first and second upper nonmagnetic intermediate layers to each other electrically so as to permit the sensing current to pass through the insulating material in a confining fashion; and
the second current control layer including:
an insulating material which insulates the first and second lower nonmagnetic intermediate layers from each other electrically, and
a conductive material which is formed in the insulating material in a distributed manner and which connects the first and second lower nonmagnetic intermediate layers to each other electrically so as to permit the sensing current to pass through the insulating material in a confining fashion.

2. The magnetoresistance effect element according to claim 1, wherein
the first unit includes a first pinning layer; and
the second unit includes a second pinning layer;
the first upper nonmagnetic intermediate layer, the first current control layer, and the second upper nonmagnetic intermediate layer are provided between the free layer and the first pining layer; and
the first lower nonmagnetic intermediate layer, the second current control layer, and the second lower nonmagnetic intermediate layer are provided between the free layer and the second pinning layer.

3. The magnetoresistance effect element according to claim 2, wherein
the first unit includes a first antiferromagnetic layer which pins the direction of magnetization of the first pinning layer; and
the second unit includes a second antiferromagnetic layer which pins the direction of magnetization of the second pinning layer.

4. The magnetoresistance effect element according to claim 1, wherein the film thickness of the insulating materials is 0.4 nanometers or more and 3 nanometers or less.

5. A magnetic head comprising the magnetoresistance effect element according to claim 1.

6. A head suspension assembly comprising:
the magnetic head according to claim 5; and
a support mechanism which supports the magnetic head with respect to the recording side of a magnetic recording medium.

7. A magnetic reproducing apparatus which comprises the head suspension assembly of claim 6 and which reads magnetic information recorded on a magnetic recording medium by use of a magnetic head installed in the head suspension assembly.

8. The magnetoresistance effect element according to claim 1, which comprises a giant magnetoresistance (GMR) effect element.

9. A magnetic reproducing apparatus which reads magnetic information recorded on a magnetic recording medium by use of a magnetic head including a magnetoresistance effect element of the dual spin valve type using a current-perpendicular-to-the-plane (CPP) system where a sensing current flows perpendicular to the stacked faces of a plurality of conductive layers, the magnetoresistance effect element comprising:
a first unit which includes a free layer; and
a second unit which includes the free layer shared with the first unit;
the first unit including:
a first upper nonmagnetic intermediate layer;
a second upper nonmagnetic intermediate layer; and
a first current control layer which limits the flow quantity of the sensing current and is sandwiched between the first and second upper nonmagnetic intermediate layers;
the second unit including:
a pinning layer;
a first lower nonmagnetic intermediate layer;
a second lower nonmagnetic intermediate layer; and
a second current control layer which limits the flow quantity of the sensing current and is sandwiched between the first and second lower nonmagnetic intermediate layers;
the first current control layer including:
an insulating material which insulates the first and second upper nonmagnetic intermediate layers from each other electrically, and
a conductive material which is formed in the insulating material in a distributed manner and which connects the first and second upper nonmagnetic intermediate layers to each other electrically so as to permit the sensing current to pass through the insulating material in a confining fashion; and
the second current control layer including:
an insulating material which insulates the first and second lower nonmagnetic intermediate layers from each other electrically, and
a conductive material which is formed in the insulating material in a distributed manner and which connects the first and second lower nonmagnetic intermediate layers to each other electrically so as to permit the sensing current to pass through the insulating material in a confining fashion.

* * * * *